United States Patent [19]

McCulloch et al.

[11] Patent Number: 5,733,714
[45] Date of Patent: Mar. 31, 1998

[54] ANTIREFLECTIVE COATING FOR PHOTORESIST COMPOSITIONS

[75] Inventors: Iain McCulloch, Murray Hill; Ralph R. Dammel; Anthony J. Corso, both of Flemington; Shuji Ding, Somerville; Dana L. Durham, Flemington; Ping-Hung Lu, Bridgewater; Ming Kang, Colonia; Dinesh N. Khanna, Flemington, all of N.J.

[73] Assignee: Clariant Finance (BVI) Limited, Virgin Islands (Br.)

[21] Appl. No.: 724,109

[22] Filed: Sep. 30, 1996

[51] Int. Cl.$^6$ .................. G03C 5/00; C03F 8/30
[52] U.S. Cl. ............. 430/325; 430/271.1; 430/327; 430/330; 430/950; 524/555; 525/326; 526/312
[58] Field of Search ................. 430/325, 270.1, 430/271.1, 327, 330, 950; 525/326; 524/555; 526/312

[56] References Cited

U.S. PATENT DOCUMENTS

| | | | |
|---|---|---|---|
| 4,491,628 | 1/1985 | Ito et al. | 430/176 |
| 4,617,252 | 10/1986 | Cordes, III et al. | 430/272 |
| 4,631,328 | 12/1986 | Ringsdorf et al. | 526/259 |
| 5,069,997 | 12/1991 | Schwalm et al. | 430/270 |
| 5,207,952 | 5/1993 | Griffin, III | 252/582 |
| 5,227,444 | 7/1993 | Muller et al. | 526/311 |
| 5,294,680 | 3/1994 | Knors et al. | 525/327.4 |
| 5,350,660 | 9/1994 | Urano et al. | 430/176 |
| 5,384,378 | 1/1995 | Etzbach et al. | 526/256 |
| 5,472,827 | 12/1995 | Ogawa et al. | 430/315 |
| 5,496,899 | 3/1996 | Foll et al. | 525/327 |
| 5,525,457 | 6/1996 | Nemoto et al. | 430/325 |
| 5,652,297 | 7/1997 | McCulloch et al. | 524/555 |
| 5,652,317 | 7/1997 | McCulloch et al. | 526/312 |
| 5,654,376 | 8/1997 | Knors et al. | 525/327.4 |

FOREIGN PATENT DOCUMENTS

| | | | |
|---|---|---|---|
| 522990 | 1/1993 | European Pat. Off. | G03F 7/09 |
| 583205 | 2/1994 | European Pat. Off. | |
| 4311761 | 10/1993 | Germany | G03F 7/09 |
| 7-153682 | 6/1995 | Japan | H01L 21/027 |
| WO 95/10798 | 4/1995 | WIPO | G03F 7/09 |
| WO 97/33200 | 9/1997 | WIPO | G03F 7/09 |
| WO 97/33201 | 9/1997 | WIPO | G03F 7/09 |

OTHER PUBLICATIONS

SPIE vol. 1927, Optical/Laser Microlithography, Mar. 3, 1993, pp. 275–286, "Optimization of Anti-reflection Layers for Deep UV Lithography", H.J. Dijkstra et al.

SPIE vol. 2724, Advances in Resist Technology and Processing XIII, Mar. 11, 1996, pp. 754–769, "Modeling of Bottom Anti-reflection Layers: Sensitivity to Optical Constants Photolithography", R.R. Dammel et al.

JP appln 6–128916 (Kokai 7–333855), Mitsubishi Chemical, Nishi et al, Dec. 22, 1995, trans. of claims.

Patent Abstracts of Japan, vol. 96, #5, Mar. 13, 1996, & JP 08 017711, Sony Corp., Jan. 19, 1996.

Patent Abstracts of Japan, vol. 12 #489(E–696), Dec. 21, 1988, & JP 63 202915, Oki Electric Ind. Co. Ltd., Aug. 22, 1988.

Patent Abstracts of Japan, vol. 7, #136(E–181), Jun. 14, 1983, & JP 58 051515, Fujitsu KK), Mar. 26, 1983.

*Primary Examiner*—Janet C. Baxter
*Assistant Examiner*—Rosemary Ashton
*Attorney, Agent, or Firm*—Sangya Jain

[57] ABSTRACT

The present invention relates to a novel antireflective coating solution and a process for its use in photolithography. The antireflective coating solution comprises a novel polymer and an organic solvent or a mixture of organic solvents, where the novel polymer comprises a unit containing a dye that absorbs from about 180 nm to about 450 nm and a unit containing a crosslinking group.

28 Claims, No Drawings

ANTIREFLECTIVE COATING FOR PHOTORESIST COMPOSITIONS

BACKGROUND OF THE INVENTION

The present invention relates to novel antireflective coating compositions and their use in forming a thin layer between a reflective substrate and a photoresist coating. Such compositions are especially useful in the fabrication of semiconductor devices by photolithographic techniques.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the photoresist.

The trend towards the minitiarization of semiconductor devices has lead to the use of sophisticated multilevel systems to overcome difficulties associated with such minitiarization. The use of highly absorbing antireflective coatings in photolithography is a simpler approach to diminish the problems that result from back reflection of light from highly reflective substrates. Two deleterious effects of back reflectivity are thin film interference and reflective notching. Thin film interference results in changes in critical linewidth dimensions caused by variations in the total light intensity in the resist film as the thickness of the resist changes. Variations of linewidth are proportional to the swing ratio (S) and therefore must be minimized for better linewidth control. Swing ratio is defined by:

$$S=4(R_1R_2)^{1/2}e^{-\alpha D}$$

where $R_1$ is the reflectivity at the resist/air or resist/top coat interface,
where $R_2$ is the reflectivity at the resist/substrate interface,
where $\alpha$ the resist optical absorption coefficient, and
D is the film thickness.
Antireflective coating function by absorbing the radiation used for exposing the photoresist, that is, reducing $R_2$ and thereby reducing the swing ratio. Reflective notching becomes severe as the photoresist is patterned over substrates containing topographical features, which scatter light through the photoresist film, leading to linewidth variations, and in the extreme case, forming regions with complete resist loss.

In the past dyed photoresists have been utilized to solve these reflectivity problems. However, it is generally known that dyed resists only reduce reflectivity from the substrate but do not totally eliminate it. In addition, dyed resists may cause reduction in the lithographic performance of the photoresist, together with possible sublimation of the dye and incompatibility of the dye in resist films. In cases where further reduction or elimination of the swing ratio is required, an antireflective coating is applied prior to coating with the photoresist and prior to exposure. The resist is exposed imagewise and developed. The antireflective coating in the exposed area is then etched, typically in an oxygen plasma, and the resist pattern is thus transferred to the substrate. The etch rate of the antireflective film should be relatively high so that the antireflective film is etched without excessive loss of the resist film during the etch process.

Antireflective coatings containing a dye for absorption of the light and an organic polymer to give coating properties are known. However, the possibility of sublimation and diffusion of the dye into the photoresist layer during the heating process can make these types of antireflective compositions undesirable.

Polymeric organic antireflective coatings are known in the art as described in EP 583,205 and U.S. Pat. No. 5,525,457 and incorporated herein by reference. However, these antireflective films are cast from organic solvents, such as cyclohexanone and cyclopentanone. The potential hazards of working with organic solvents, have lead to the development of the antireflective coating composition of the instant invention, where the solid components of the antireflective coating are both soluble and spin castable from solvents having lesser toxicity hazards. The preferred solvents that are known in the semiconductor industry to have low toxicity among others are propylene gycol monomethyl etheracetate (PGMEA), propylene gycol monomethylether (PGME), and ethyl lactate.

In another embodiment, by the judicious choice of electrophilic substituents and comonomers, the polymer of the present invention is castable from water. Water based coatings are not only preferred but also provide a distinct advantage in the semiconductor industry due to their ease of handling.

The novel dye functionality of the instant invention, together with the specific types of monomers used, make the instant invention of great significance in the photoresist technology. The antireflective coating gives good coatings and additionally, no intermixing is present between the antireflective coating and the photoresist film. It also has good dry etching properties, which enable a good image transfer from the resist to the substrate and good absorption characteristics to prevent reflective notching and linewidth variations.

SUMMARY OF THE INVENTION

The present invention relates to a novel antireflective coating composition and a process for its use in photolithography. The polymer of the antireflective coating composition comprises at least one unit with a dye functionality and at least one unit with a crosslinking group. The dye functionality is one that strongly absorbs radiation ranging from about 180 nm (nanometer) to about 450 nm. The types of dyed monomeric units that can be used are defined by the following structure:

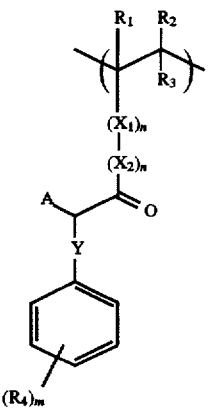

Structure 1 where $R_1$–$R_3$ are independently H, ($C_1$–$C_{10}$) alkyl or ($C_1$–$C_{10}$) alkoxy, $X_1$ is C=O, OCO, CONH, O, aryl, ($C_1$–$C_{10}$) alkyl, cyclohexyl, pyridine or pyrollidone, $X_2$ is S, S($C_1$–$C_{10}$)alkyl, O, O($C_1$–$C_{10}$) alkyl, NH, N($C_1$–$C_{10}$) alkyl, alkyl, or hydroxyalkyl($C_1$–$C_{10}$), n=0–2, A is an electronwithdrawing group, preferrably $COR_4$, CN or CNZ $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, alkali metal, ammonium or alkyl ammonium, Y is a conjugated moiety e.g. N=N, CW=CW, CW=N, or N=CW, where W is H, ($C_1$–$C_{10}$) alkyl or ($C_1$–$C_{10}$) alkoxy, and m=1–5.

The more preferred structure for the dye unit is,

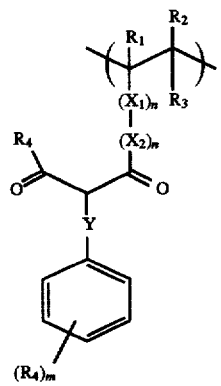

where $R_1$–$R_3$ are independently H, ($C_1$–$C_{10}$) alkyl or ($C_1$–$C_{10}$) alkoxy, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl or hydroxyalkyl($C_1$–$C_{10}$), n=0–2, $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, alkali metal, ammonium or alkyl ammonium, Y is a conjugated moiety e.g. N=N, CW=CW, CW=N, or N=CW, where W is H, ($C_1$–$C_{10}$) alkyl or ($C_1$–$C_{10}$) alkoxy, and m=1–5.

The unit containing the crosslinking group is defined by the structure,

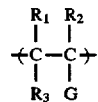

Structure 2 where G contains the crosslinking functionality and $R_1$ to $R_3$ are independently H ($C_1$–$C_{10}$) alkyl or ($C_1$–$C_{10}$) alkoxy, and where the crosslinking groups are typically methylol acrylamides, methacrylamides, acrylamides, ethylene end groups, epoxies, and isocyanates.

In another preferred embodiment, where the antireflective coating is water soluble, a hydrophilic monomeric unit is also present in the polymer that promotes water solubility in the copolymer and can be represented by the structure:

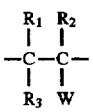

where $R_1$ to $R_3$ is H, ($C_1$–$C_{10}$) alkyl, ($C_1$–$C_{10}$) alkoxy and W is a hydrophilic group. Examples of the hydrophilic group, W, are given here but are not limited to these: $O(CH_2)_2$—O—$(CH_2)$—OH, $O(CH_2)_2$—OH, $(CH_2)_n$—OH (where n=1–4), COO($C_1$–$C_4$) alkyl, COOX, $SO_3X$ (where X is H, alkali metal, ammonium, alkyl ammonium), $CONHCH_2OH$. Other hyrodophilic vinyl monomers that can also be used in the polymer are, maleic anhydride, fumaric anhydride, vinyl pyridines, and vinyl pyrollidones.

The invention further comprises a process of forming an image on a substrate. The substrate is coated with the film of the antireflective coating of the instant invention and heated to remove any residual solvent and to insolubilize the coating. A film from a photoresist solution is then formed on top of the antireflective coating and further heated to substantially remove the photoresist solvent. The photoresist film is imagewise exposed through a mask with ultraviolet radiation ranging from about 180 nm to about 450 nm and processed in an aqueous alkaline developer to give a photoresist pattern. The substrate may be heated prior to and after the development step to give an image of superior quality. The exposed antireflective film can then be dry etched, usually in an oxygen plasma, with the photoresist pattern acting as an etch mask.

DETAILED DESCRIPTION OF THE INVENTION

The antireflective compositions of the present invention comprise a polymer obtained by reacting at least one monomer containing a dye functionality and at least one monomer containing a crosslinking group, and where the polymer thus obtained strongly absorbs ultraviolet light having a wavelength in the range of 180 nm to about 450 nm. The present invention further provides for a process of coating and baking the antireflective coating on a substrate and applying and imaging a photoresist film on top of the antireflective coating, and followed by etching of the antireflective coating.

The polymer of the instant invention is obtained by reacting at least one vinyl monomer containing a dye functionality and at least one vinyl monomer containing a crosslinking group. The dye groups are ones that strongly absorb radiation ranging from about 180 nm to about 450 nm. The preferred types of dyed monomeric units that can be used are defined by the following structure:

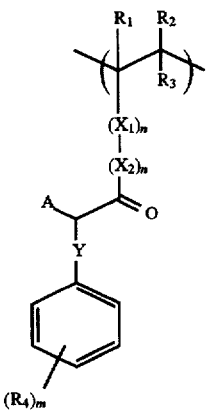

Structure 1 where $R_1$–$R_3$ are independently H, ($C_1$–$C_{10}$) alkyl or ($C_1$–$C_{10}$) alkoxy, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$), n=0–2, A is an electronwithdrawing group, preferably $COR_4$, CN or CNZ, $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, Y is a conjugated moiety e.g. N=N, CW=CW, CW=N, or N=CW, where W is H, ($C_1$–$C_{10}$) alkyl or ($C_1$–$C_{10}$) alkoxy, and m=–5.

The more preferred structure for the dye unit is,

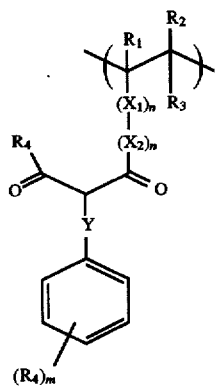

where $R_1$–$R_3$ are independently H, ($C_1$–$C_{10}$) alkyl or ($C_1$–$C_{10}$) alkoxy, $X_1$ is C=O, OCO, CONH, O, aryl, ($C_1$–$C_{10}$) alkyl, cyclohexyl, pyridine or pyrollidone, $X_2$ is S, S($C_1$–$C_{10}$) alkyl, O, O($C_1$–$C_{10}$) alkyl, NH, N($C_1$–$C_{10}$) alkyl, alkyl, or hydroxyalkyl($C_1$–$C_{10}$), n=0–2, $R_4$ is H, ($C_1$–$C_{10}$) alkyl, ($C_1$–$C_{10}$) alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, $SO_2NZ_2$, where Z is H or ($C_1$–$C_{10}$) alkyl, Y is a conjugated moiety e.g. N=N, CW=CW, CW=N, or N=CW, where W is H, ($C_1$–$C_{10}$) alkyl or ($C_1$–$C_{10}$) alkoxy, and m=1–5.

The crosslinking groups present in the antireflective polymer are typically methylol acrylamides, methacrylamides, acrylamides, ethylene end groups, epoxies, isocyanates, but methylol acrylamides and epoxy groups are preferred. The presence of crosslinking groups in the antireflective film are essential to the invention, since the film must be made insoluble in both the solvent of the photoresist and in the developer of the resist, where the developer is an aqueous alkaline solution. Heating the antireflective film after the coating process induces crosslinking of the polymer and hence makes the coating insoluble in the aqueous developer. However, the crosslinking functionality must be stable in the solution of the antireflective polymer and crosslink when heated at temperatures greater than about 70° C. The crosslinking monomeric unit is represented by the following structure:

Structure 2 where G contains the crosslinking functionality and $R_1$ to $R_3$ is H, ($C_1$–$C_{10}$) alkyl or ($C_1$–$C_{10}$) alkoxy.

Specific examples of crosslinking functionality are shown in the following diagram but are not limited to,

(1)

(2)

(3)

(4)

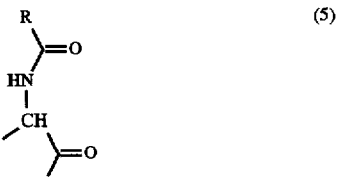

(5)

where (1) is a carbodiimide, (2) an isocyanate or blocked equivalent, (3) glycidyl acrylate or methacrylate, (4) an alkylol acrylamide or methacrylamide and, (5) methyl acrylamidoglycolate methyl ether, R is ($C_1$-$C_{10}$) alkyl, and R' is H or ($C_1$-$C_{10}$) alkyl.

In another embodiment a hydrophilic monomeric unit that promotes water solubility in the copolymer is present in the polymer together with a unit containing a dye functionality and a unit containing a crosslinking functionality, and where the hydrophilic monomer can be represented by the structure:

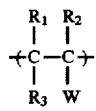

where $R_1$ to $R_3$ are independently H, ($C_1$-$C_{10}$) alkyl, ($C_1$-$C_{10}$) alkoxy and W is a hydrophilic group. Examples of the hydrophilic group, W, are given here but are not limited to these: $O(CH_2)_2$—O—$(CH_2)$—OH, $O(CH_2)_2$—OH, $(CH_2)_n$—OH (where n=1–4), COO($C_1$-$C_4$) alkyl, COOX, $SO_3X$ (where X is H, alkali metal, ammonium, alkyl ammonium), $CONHCH_2OH$. Other hyrodophilic vinyl monomers that can also be used in the polymer are, maleic anhydride, fumaric anhydride, vinyl pyridines, and vinyl pyrollidones.

The water soluble antireflective polymer can be synthesized by reacting any number of vinyl monomers containing at least one dye functionality described in Structure 1, any number of vinyl monomers containing at least one crosslinking functionality (Structure 2) and any number of hydrophilic vinyl monomers. Mixtures of different dye monomers, different crosslinking monomers and different hydrophilic monomers can be polymerized to give an antireflective coating with the optimally desired lithographic and physical properties. Other unsaturated monomers can be added to the polymerization mixture that do not greatly effect the function or reduce the aqueous solubility of the antireflective coating. Examples of such unsaturated monomers are, maleic anhydride, vinyl acrylates, vinyl ethers, vinyl acrylamides, vinyl carboxylic acids, vinyl sulphonic acids and N-(3-hydroxyphenylmethacrylamide). Alternatively, the dye can be functionalized to a copolymer to give the polymer of the current invention.

The antireflective polymer that is soluble in organic solvents can be synthesized by reacting any number of vinyl monomers containing at least one dye functionality described in Structure 1 and any number of vinyl monomers containing at least one crosslinking functionality as described in Structure 2. Mixtures of different dye monomers from Structure 1 with different substituents and different crosslinking monomers from Structure 2 can be polymerized to give an antireflective coating with the desired lithographic and physical properties. The substituents on each of the monomers can be chosen such that the polymer formed from these monomers is soluble in an organic solvent. Other unsaturated monomers can be added to the polymerization mixture that do not greatly effect the function of the antireflective coating. Examples of such unsaturated monomers are maleic anhydride, vinyl acrylates and methacrylates, vinyl ethers, vinyl acrylamides, vinyl phenolits, vinyl carboxylic acids, vinyl sulphonic acids and N-(3-Hydroxyphenylmethacrylamide). Alternatively, the dye can be functionalized to a copolymer to give the polymer of the current invention.

The process used for polymerization can be any of the ones known in the art for polymerizing vinyl polymers, such as, ionic or free radical polymerization. The polymer structure formed can be composed of alternate, block or random copolymers. The weight average molecular weight of the polymer ranges from about 2,500 to about 1,000,000.

The monomers can be polymerized in a organic solvent, where the solvent is the same as the casting solvent of the antireflective coating, preferrably PGMEA, PGME or ethyl lactate.

The mole % of the dye containing monomer can range from about 5 to 95, and the mole % of the crosslinking monomer can range from about 1 to about 50 in the final polymer. The water based antireflective coating may contain from about 5 to 95 mole % dye unit, from about 1 to 50 mole % crosslinking unit and from about 1 to 50 mole % of hydrophilic unit. Additionally, the polymer may contain unreacted precursors and/or monomers from the synthetic steps of the preparation of the polymer.

The antireflective coating composition comprises the polymer of the instant invention and a suitable solvent or mixtures of solvents. Other components may be added to enhance the performance of the coating, e.g. monomeric crosslinking agents, monomeric dyes, lower alcohols, additives to promote crosslinking, acid generators, thermally activated acid generators, surface levelling agents, adhesion promoters, antifoaming agents etc. Examples of crosslinking agents include, but are not limited to, melamines, hydroxy alkyl amides, epoxy and epoxy amine resins, blocked isocyanates, and divinyl monomers. Thermally activated acid generators can be, but are not limited to, predominantly 2,1,4 diazonaphthoquinone esters of multihydroxy phenolic compounds. Monomeric dyes may also be added to the antireflective coating, examples of which are sudan orange, 2,4-dinitronaphthol, curcumin, coumarins and others.

The absorption of the antireflective coating can be optimized for a certain wavelength or ranges of wavelengths by the suitable choice of substituents on the dye functionality. Using substituents that are electron-withdrawing or electron donating generally shifts the absorption wavelength to longer or shorter wavelengths respectively. In addition, the solubility of the antireflective polymer in a particularly preferred solvent can be adjusted by the appropriate choice of substituents on the monomer.

The polymer of the antireflective coating composition is present in the range of about 1% to about 30% by total weight of solution. The exact weight used is dependent on the molecular weight of the polymer and the film thickness of the coating desired. Typical solvents, used as mixtures or alone, that can be used are propylene glycol monomethyl ether (PGME), propylene glycol monomethyl etheracetate (PGMEA), ethyl lactate, water, cyclopentanone, cyclohexanone, and gamma butyrolactone, but PGME, PGMEA and ethyl lactate or mixtures thereof are preferred. Solvents with a lower degree of toxicity, and good coating and solubility properties are generally preferred.

Since the antireflective film is coated on top of the substrate and is further subject to dry etching it is envisoned that the film is of sufficiently low metal ion level and purity that the properties of the semiconductor device are not adversely effected. Treatments such as passing a solution of the polymer through an ion exchange column or a combination of anion and cation exchange columns, filtration, and an extraction process can be used to reduce the concentration of metal ions and to reduce particles. Metal ion levels in the polymer below 50 ppb each metal are preferred, below 10 ppb are more preferred and below 1 ppb are even more preferred.

The antireflective coating composition is coated on the substrate using techniques well known to those skilled in the art, such as dipping, spincoating or spraying. The film thickness of the antireflective coating ranges from about 0.1 micron to about 1 micron. The coating is further heated on a hot plate or convection oven to remove any residual solvent and to induce the appropriate degree of crosslinking in order to insolubilize the film.

Photoresists coated over the antireflective film can be any of the types used in the semiconductor industry provided the sensitivity of the photoactive compound in the photoresist matches that of the antireflective coating.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Positive-acting photoresists comprising novolak resins and quinone-diazide compounds as photoactive compounds are well known in the art. Novolak resins are typically produced by condensing formaldehyde and one or more multi-substituted phenols, in the presence of an acid catalyst, such as oxalic acid. Photoactive compounds are generally obtained by reacting multihydroxyphenolic compounds with naphthoquinone diazide acids or their derivatives. The sensitivity of these types of resists typically ranges from about 350 nm to 440 nm.

Photoresists sensitive to short wavelengths, between about 180 nm and about 300 nm can also be used. These resists normally comprise polyhydroxystyrene or substituted polyhydroxystyrene derivatives, a photoactive compound, and optionally a solubility inhibitor. The following references exemplify the types of photoresists used and are incorporated herein by reference. U.S. Pat. No. 4,491,628, U.S. Pat. No. 5,069,997 and U.S. Pat. No. 105,350,660.

The process of the instant invention further comprises coating a substrate with the novel antireflective coating and heating on a hotplate or convection oven at a sufficiently high temperature for sufficient length of time to remove the coating solvent and crosslink the polymer to a sufficient extent so as not to be soluble in the coating solution of the photoresist or in the aqueous alkaline developer. The preferred range of temperature is from about 70° C. to about 250° C. If the temperature is below 70° C. then insufficient loss of solvent or insufficient degree of crosslinking takes place and at temperatures above 250° C. the polymer may become chemically unstable. A film of photoresist is then coated on top of the antireflective coating and baked to substantially remove the photoresist solvent. The photoresist is imagewise exposed and developed in an aqueous developer to remove the treated resist. An optional heating step can be incorporated into the process prior to development and after exposure. The process of coating and imaging photoresists is well known to those skilled in the art and is optimized for the specific type of resist used. The patterned substrate can then be dry etched in a suitable etch chamber to remove the exposed portions of the antireflective film, with the remaining photoresist acting as an etch mask.

An intermediate layer may be placed between the antireflective coating and the photoresist to prevent intermixing, and is envisioned as lying within the scope of this invention. The intermediate layer is an inert polymer cast from a solvent, where examples of the polymer are polysulfone and polyimides.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Polymer 1 - Example 1. Preparation of the diazonium salt of ethyl-4-aminobenzoate Ethyl 4-aminobenzoate (50.57 g, 0.3 mol) was dissolved in 61 ml (0.75 mol) of concentrated hydrochloric acid and 600 ml of methanol contained in a 1000 ml round-bottom flask. The flask was then immersed in a bath of crushed ice, and cooled until the temperature of the solution was below 3° C. The solution turned into a white suspension. Diazotization was then facilitated by the addition of 33.3 g (0.31 mol) tert-butyl nitrite at a temperature below 5° C. The diazonium solution was then stirred in an ice-water bath for about 1 hour. The product forms as a yellow solution in methanol and was not isolated, but used as a reagent in Example 2.

Polymer 1 - Example 2. Preparation of the methacrylate monomer 2-(Methacryloyloxy)ethyl acetoacetate (66.25 g, 0.3 mol) and triethylamine (76.66 g, 0.75 mol) were added to methanol (1500 ml) and the solution stirred and cooled below 5° C. in an ice-water bath. To this solution, the cold diazonium salt solution, formed in Example 1, was then slowly added, while the temperature was maintained between 5° C. to 10° C. The reaction mixture was allowed to stir for 4 hours while warming to room temperature resulting in the formation of the product as a red suspension. This was then filtered, washed with methanol and dried under vacuum to yield 89.7 g (77%) of yellow product.

Polymer 1 - Example 3. Preparation of Copolymer

The methacrylate monomer formed in Example 2 (21.47 g, 0.055 mol) was dissolved in 125 ml of γ-butyrolactone solvent. The solution was warmed to 65° C. while stirred. On complete dissolution, the solution was degassed by vigorously bubbling argon, via an inlet needle in a sealed rubber septum, through the solution for about 2 hours. N-(Hydroxymethyl)acrylamide (0.899 ml, 4.58 mmol) and methyl methacrylate (3.47 ml, 32 mmol) were then injected into the solution through the septum and the polymerization mixture was further degassed for 30 minutes. An aliquot from a solution of AIBN (0.1843 g, 0.92 mmol, 1 mol % total monomer) in γ-butyrolactone (1.5 ml) was then injected and the solution degassed further for 30 minutes. In total, 2 aliquots were added at intervals of 5 hours. Both inlet and outlet needles were then removed and the sealed vessel allowed to stir at 65° C. for 20 hours. This solution was then diluted with ethyl acetate (500 ml) then precipitated into a fivefold excess of 2-propanol. The polymer forms as a yellow solid (23.25 g) which was then collected by filtration and dried. The yield was 92%.

Polymer 2 - Example 4. Preparation of the diazonium salt of 4-aminobenzoic acid.

4-Aminobenzoic acid (13.85 g, 0.1 mol) was dissolved in 20 ml (0.25 mol) of concentrated hydrochloric acid and 150 ml of methanol contained in a 300 ml round-bottom flask. The flask was then immersed in a bath of crushed ice, and cooled until the temperature of the solution was below 3° C. The solution turned into a white suspension. Diazotization was then facilitated by the addition of 11.82 g (0.11 mol) tert-butyl nitrite at a temperature below 5° C. The diazonium solution was then stirred in an ice-water bath for about 1 hour. The product forms as a off white suspension in methanol and was not isolated, but used as a reagent in Example 5.

Polymer 2 - Example 5. Preparation of the methacrylate monomer.

2-(Methacryloyloxy)ethyl acetoacetate (22.08 g, 0.1 mol) and triethylamine (25.55 g, 0.25 mol) were added to methanol (200 ml) and the solution stirred and cooled below 5° C. in an ice-water bath. To this solution, the cold diazonium salt solution formed in Example 4, was then slowly added, while the temperature was maintained between 10° to 20° C. The reaction mixture was allowed to stir for 2.5 hours while warming to room temperature resulting in the formation of the product as a yellow suspension. This was poured into 2000 ml of distilled water, then filtered, and dried under vacuum to yield a yellow solid product.

Polymer 2 - Example 6. Preparation of Copolymer.

The methacrylate monomer formed in Example 5 (5.25 g, 0.02 mol) was dissolved in 35 ml of γ-butyrolactone solvent. The solution was warmed to 65° C. while stirred. On complete dissolution, the solution was degassed by vigorously bubbling argon, via an inlet needle in a sealed rubber septum, through the solution for about 2 hours. N-(hydroxymethyl)acrylamide (1.53 g, 0.012 mol) and methyl methacrylate (1.2 g, 0.12 mol) were then injected into the solution through the septum and the polymerization mixture was further degassed for 3 0 minutes. An aliquot from a solution of AIBN (0.6138 g, 3.66 mmol, 1 mol % total monomer) in γ-butyrolactone (3.5 ml) was then injected and the solution degassed further for 30 minutes. In total, 2 aliquots were added at intervals of 5 hours. Both inlet and outlet needles were then removed and the sealed vessel allowed to stir at 65° C. for 20 hours. This solution was then diluted with ethyl acetate (500 ml) then precipitated into a fivefold excess of 2-propanol. The polymer forms as a yellow solid which was then collected by filtration and dried.

Polymer 3 - Example 7. Preparation of Copolymer.

The methacrylate monomer formed in Example 2 (21.47 g, 55 mmol) was dissolved in 125 ml of γ-butyrolactone solvent. The solution was warmed to 65° C. while stirred. On complete dissolution, the solution was degassed by vigorously bubbling argon, via an inlet needle in a sealed rubber septurn, through the solution for about 2 hours. Methyl 2-acrylamido-2-methoxyacetate (1.94 g, 11 mmol) and methyl methacrylate (4.45 g, 44 mmol) were then injected into the solution through the septum and the polymerization mixture was further degassed for 30 minutes. An aliquot from a solution of AIBN (0.1843 g, 0.92 mmol, 1 mol % total monomer) in γ-butyrolactone (1.5 ml) was then injected and the solution degassed further for 30 minutes. In total, 2 aliquots were added at intervals of 5 hours. Both inlet and outlet needles were then removed and the sealed vessel allowed to stir at 65° C. for 20 hours. This solution was then diluted with ethyl acetate (500 ml) then precipitated into a fivefold excess of 2-propanol. The polymer forms as a yellow solid (20.82 g) which was then collected by filtration and dried. The yield was 75%.

Example 8

To a solution of 3.5 grams of the polymer from Example 3( Polymer 1) in 46.5 grams of PGMEA was added 0.035 grams of 2,1,4-diazonaphthoquinonesulfonic esters. The solution was filtered with 0.2 µm PTFE filter, spin coated on a 4" silicon wafer, and baked on a hot plate at 170° C. for 60 seconds to achieve a thickness of about 2000 Å. The coated wafers were immersed in various resist casting solvents such as PGMEA, 85/15 ethyl lactate (EL)/n-Butyl Acetate (n-BA) solvent mixture as well as in AZ®300 MIF developer (available from Hoechst Celanese Corporation, 70 Meister Ave., Somerville, N.J. 08876). The film thickness before and after immersion were measured with a NANOSPEC-AFT. The extent of interlayer mixing between the polymer and the solvent was determined by the changes of the polymer film thickness as listed in the following table.

TABLE 1

| Solvent | $T_1$ | $T_2$ | $T_3$ | $T_4$ |
|---|---|---|---|---|
| PGMEA | 2030Å | 2029Å | 2027Å | 2028Å |
| 85/15 EL/n-BA | 2024Å | 2029Å | 2021Å | 2023Å | where
$T_1$: polymer film thickness after spin coating
$T_2$: polymer film thickness after immersion in the photoresist solvent for 30 seconds
$T_3$: polymer film thickness after softbaked at 90° C. for 90 seconds
$T_4$: polymer film thickness after immersion in the AZ ® 300 MIF developer for 35 seconds The process condition described for $T_1$ to $T_4$ mimic a typical coating and developing procedure of a positive photoresist on a bottom antireflective coating. It is clear that the solubility of the polymer of present invention with typical photoresist casting solvent and developer is negligible.

Example 9

To a solution of 3.5 grams of the polymer from Example 3(Polymer 1) in 46.5 grams of PGMEA was added 0.52 grams of CYMEL®303 and 0.05 grams of CYCAT®296-6 (both available from Cytec Industries Inc.) The solution was filtered with 0.2 μm PTFE filter, spin coated on a 4" silicon wafer, and baked on a hot plate at 170° C. for 60 seconds. The coated wafers were immersed in PGMEA and EL for 20 seconds and in AZ®300 MIF developer for 40 seconds. After spin dried, no changes on film thickness were observed.

Example 10

The polymer solutions formulated in Examples 8 and 9 were spin coated on several 4" silicon wafer and baked on a hot plate at 170° C. for 60 seconds to give a thickness of 2000 Å. The wafers were then coated with AZ® 7805 (available from Hoechst Celanese Corporation, 70 Meister Ave., Somerville, N.J. 08876) and baked using a temperature of 90° C. for 90 seconds to give thickness from 0.5 μm (micrometers). A 4" silicon wafer coated with 5000 Å AZ® 7805 photoresist and baked at 90° C. on a hot plate for 60 seconds was used as the reference. These wafers were imagewise exposed with a NIKON® 0.54 NA i-line stepper using a reticle contains line size from 0.2 μm to 1.0 μm and a program that directs the stepper to print a 15×21 focus/exposure matrix with dose increments of 2 mJ/cm$^2$ and focus increment of 0.2 μm. The exposed wafers were baked at 110° C. for 60 seconds and puddle developed with AZ® 300 MIF developer for 35 seconds. The resist pattern generated on these wafers were evaluated by a Hitachi S-4000 field emission scanning electron microscope. Table 2 shows the comparison of AZ® 7805 on the bottom antireflective coatings of the present invention versus AZ® 7805 on a bare silicon wafer.

TABLE 2

| Bottom Coating | DTP (mJ/cm2) | Resolution | Standing Wave |
|---|---|---|---|
| Example 8 | 210 | 0.28 μm | No |
| Example 9 | 205 | 0.28 μm | No |
| none | 195 | 0.38 μm | Severe |

DTP is the dose to print.

The bottom polymer coatings of the present invention clearly improve the resolution and effectively eliminate the standing waves, that is, reflectivity, without sacrificing photosensitivity.

Example 11

To a solution of 3.5 grams of the polymer from Example 7 (Polymer 3) in 46.5 grams of PGMEA was added 0.52 grams of CYMEL® 303 and 0.05 grams of CYCAT® 296-6. The solution was filtered with 0.2 μm PTFE filter, spin coated on a 4" silicon wafer, and baked on a hot plate at 170° C. for 60 seconds to give a thickness of 2000 Å. The wafers were then coated with AZ® 7805 and baked using a temperature of 90° C. for 90 seconds to give thickness from 0.5 μm (micrometers). A 4" silicon wafer coated with 5000 Å AZ® 7805 photoresist and baked at 90° C. on a hot plate for 60 seconds was used as the reference. These wafers were imagewise exposed with a NIKON® 0.54 NA i-line stepper using a reticle contains line size from 0.2 μm to 1.0 μm and a program that directs the stepper to print a 15×21 focus/exposure matrix with dose increments of 2 mJ/cm$^2$ and focus increment of 0.2 μm. The exposed wafers were baked at 110° C. for 60 seconds and puddle developed with AZ® 300 MIF developer for 35 seconds. The resist patterns generated on these wafers were evaluated by a Hitachi S-4000 field emission scanning electron microscope. Table 3 shows the comparison of AZ® 7805 on the bottom polymer coating of the present invention versus AZ® 7805 on a bare silicon wafer.

TABLE 3

| Bottom Coating | DTP (mJ/cm2) | Resolution | Standing Wave |
|---|---|---|---|
| Example 11 | 230 | 0.28 μm | No |
| none | 195 | 0.38 μm | Severe |

The polymer coating described in this example clearly shows improved resolution compared to photoresist without the bottom antireflective coating and is capable of eliminating the standing waves, that is, reflectivity, without significantly sacrificing the photosensitivity.

Example 12. Swing Ratio Reduction Test

The swing ratio of a photoresist is closely related to the linewidth variation of the photoresist pattern over a highly reflective substrate or topography commonly encountered in a semiconductor device manufacturing. The lower the swing ratio, the better the linwidth control over reflective substrate or topography. The swing ratio was calculated by the equation:

$$(Emax - Emin)/(Emax + Emin)$$

where Emax and Emin corresponding to the dose-to-clear of a resist thickness at the maximum and minimum on a swing curve. Swing curve were generated by ploting the dose requied to clear a resist film after developement as a function of the resist thickness.

Several 4" wafers were coated with AZ® 7805 to give thickness from 0.5 μm to 1.0 μm using a soft bake temperature of 90° C. for 90 seconds. These wafers were imagingwise exposed with a NIKON 0.54 NA i-line stepper, then baked at 110° C. for 60 seconds and puddle developed with AZ® 300 MIF developer for 35 seconds. The minimum dose required to clear the film is plotted as a function of corresponding resist thickness, a sinusoidal curve thus obtain is called the swing curve.

The Swing ratio of the polymers of Examples in 9 and 11 are given in the following table.

TABLE 4

| Sample | % Swing Reduction |
|---|---|
| AZ ® 7805 | 0 |
| Example 9(Polymer 1) | 92.05 |
| Example 11(Polymer 3) | 93.86 |

It's clearly shown that both of the present invention effectively reduce the swing curve ratio by about 92%.

Polymer 4 - Example 13

2-(Methacryloyloxy)ethyl acetoacetate (57.42 g, 0.26 mol) and diethylene glycol monovinyl ether (18.5 g, 0.14 mol) were dissolved in 330 ml of γ-butyrolactone solvent. The solution was warmed to 65° C. while being stirred. The solution was then degassed by vigorously bubbling argon, via an inlet needle in a sealed rubber septurn, through the solution for about 2 hours. An aliquot from a solution of AIBN (0.657 g, 4 mmol, 1 mol % total monomer) in γ-butyrolactone (3.5 ml) was then injected and the solution degassed further for 30 minutes. In total, 2 aliquots were added at intervals of 5 hours. Both inlet and outlet needles were then removed and the sealed vessel allowed to stir at 65° C. for 20 hours. The product formed was then used as a reagent in Example 15.

Polymer 4 - Example 14

To a solution of tetramethyl ammonium hydroxide in water (25% solids) (72 ml, 0.2 mol) and water (150 ml) was added sulfanilic acid (34.99 g, 0.2 mol), followed by isobutyl nitrite (26 ml. 0.21 mol) and the resultant suspension temperature maintained below 10° C. A solution of HCl (37.8 wt % in water) (32.5 ml, 0.4 mol) was added to water (35 ml) and the solution slowly added to the reaction mixture, forming the diazonium salt, which was then transferred to a pressure equalizing dropping funnel and used as a reagent in Example 15.

Polymer 4 - Example 15

To the polymer solution formed in Example 13, was added DMSO (500 ml) and tetramethyl ammonium hydroxide solution in water (144 ml, 0.4 mol), and the mixture stirred while cooling to below 10° C. To this, was then added, dropwise, the product from Example 14, and the resultand red solution allowed to stir at room temperature overnight. The solution was then precipitated into 2-propanol (2000 ml), allowing the polymer to form as a solid product.

The polymer was dissolved in water and coated on a silicon wafer. The polymer functioned as a bottom antireflective coating for a photoresist composition.

We claim:
1. An antireflecting coating composition for use in photolithography, comprising
a) a polymer comprising at least one dye unit having a structure,

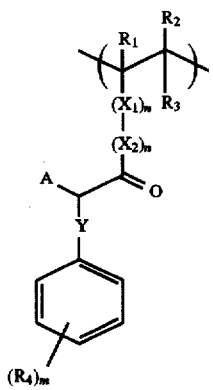

where $R_1$–$R_3$ are independently H, $(C_1$–$C_{10})$ alkyl or $(C_1$–$C_{10})$ alkoxy, $X_1$ is C=O, OCO, CONH, O, aryl, $(C_1$–$C_{10})$ alkyl, cyclohexyl, pyridine or pyrollidone, $X_2$ is S, S$(C_1$–$C_{10})$ alkyl, O, O$(C_1$–$C_{10})$ alkyl, NH, N$(C_1$–$C_{10})$ alkyl, alkyl, or hydroxyalkyl$(C_1$–$C_{10})$, n=0-2, A is an electronwithdrawing group, $R_4$ is H, $(C_1$–$C_{10})$ alkyl, $(C_1$–$C_{10})$ alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, or $SO_2NZ_2$, where Z is H or $(C_1$–$C_{10})$ alkyl, Y is a conjugated moiety N=N, CW=CW, CW=N, or N=CW, where W is H, $(C_1$–$C_{10})$ alkyl or $(C_1$–$C_{10})$ alkoxy.

m=1-5, and at least one unit capable of crosslinking the polymer having a structure

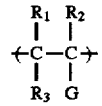

where G contains a crosslinking functionality and $R_1$ to $R_3$ are independently H, $(C_1$–$C_{10})$ alkyl or $(C_1$–$C_{10})$ alkoxy, and b) a suitable solvent.

2. The antireflective coating composition according to claim 1, wherein the dye unit has a structure

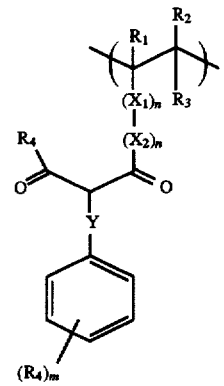

where $R_1$–$R_3$ are independently H, $(C_1$–$C_{10})$ alkyl or $(C_1$–$C_{10})$ alkoxy, $X_1$ is C=O, OCO, CONH, O, aryl, $(C_1$–$C_{10})$ alkyl, cyclohexyl, pyridine or pyrollidone, $X_2$ is S, S$(C_1$–$C_{10})$ alkyl, O, O$(C_1$–$C_{10})$ alkyl, NH, N$(C_1$–$C_{10})$ alkyl, alkyl, or hydroxyalkyl$(C_1$–$C_{10})$, n=0-2, $R_4$ is H, $(C_1$–$C_{10})$ alkyl, $(C_1$–$C_{10})$ alkoxy, nitro, halide, cyano, aryl, alkylaryl, alkenyl, dicyanovinyl or $SO_2CF_3$, COOZ, $SO_3Z$, COZ, OZ, $NZ_2$, SZ, $SO_2Z$, NHCOZ, or $SO_2NZ_2$, where Z is H or $(C_1$–$C_{10})$ alkyl, Y is a conjugated moiety N=N, CW=CW, CW=N, or N=CW, where W is H, $(C_1$–$C_{10})$ alkyl or $(C_1$–$C_{10})$ alkoxy, and m=1-5.

3. The antireflective composition according to claim 1, wherein the solvent comprises a mixture of organic solvents.

4. The antireflective composition according to claim 1, wherein the solvent is selected from a group consisting of propylene glycol monomethyl ether, propylene glycol monomethyl etheracetate, ethyl lactate, heptanone, cyclopentanone, cyclohexanone, and gamma butyrolactone.

5. The antireflective composition according to claim 1, wherein the solvent comprises water.

6. The antireflective composition according to claim 1, wherein the crosslinking group is selected from a group consisting of carbodiimide, isocyanate, blocked isocyanate, glycidyl methacrylate, alkylol acrylamide, alkylol methacrylamide and methyl acrylamidoglycolate.

7. The antireflective composition according to claim 1, wherein Y in the dye unit is an azo moiety.

8. The antireflective composition of claim 1, wherein the dye unit ranges from about 5 to about 95 mole percent and the crosslinking unit ranges from about 1 to about 50 mole percent of the polymer.

9. The antireflective composition according to claim 1, wherein the polymer further comprises one or more vinyl monomers that are nonabsorbing and noncrosslinking.

10. The antireflective composition according to claim 9, wherein the vinyl monomer is selected from a group consisting of maleic anhydride, vinyl acrylates, vinyl phenolics, vinyl ethers, vinyl acrylamides, vinyl carboxylic acids, vinyl sulphonic acids and N-(3-Hydroxyphenylmethacrylamide).

11. The antireflective composition according to claim 1, further comprising at least one unit derived from a hydrophilic vinyl monomer or a vinyl monomer capable of becoming hydrophilic.

12. The antireflective composition according to claim 11, where the hydrophilic vinyl monomer has a structure:

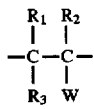

where $R_1$–$R_3$ are independently H, ($C_1$–$C_{10}$) alkyl or ($C_1$–$C_{10}$) alkoxy and W is a hydrophilic group.

13. The aqueous antireflective composition according to claim 12, wherein the hydrophilic group is selected from a group consisting of $O(CH_2)_2$—$O(CH_2)$—OH, $O(CH_2)_2$—OH, $(CH_2)_n$—OH (where n=1–4), $COO(C_1$–$C_4)$alkyl, COOX, $SO_3X$ (where X is H, alkali metal, ammonium, alkyl ammonium) and $CONHCH_2OH$.

14. The antireflective composition according to claim 11, where the hydrophilic vinyl monomer is selected from a group consisting of maleic anhydride, fumaric anhydride, vinyl pyridines, and vinyl pyrollidones.

15. The antireflective composition according to claim 11, wherein the dye unit ranges from about 5 to about 95 mole percent, the crosslinking unit ranges from about 1 to about 50 mole percent and the hydrophilic vinyl monomer ranges from about 1 to about 50 mole percent of the polymer.

16. The antireflective composition according to claim 1, further comprising a dye.

17. The antireflective composition according to claim 1, further comprising a crosslinking agent.

18. The antireflective composition according to claim 1, further comprising an acid generator.

19. The antireflective composition according to claim 18, wherein the acid generator is a thermally activated acid generator.

20. The antireflective composition according to claim 19, wherein the thermally activated acid generator is a diazo naphthoquinone ester of a multihydroxybenzophenone.

21. The antireflective composition according to claim 1, wherein the polymer has a weight average molecular weight in the range of about 2,500 to about 1,000,000.

22. The antireflective composition according to claim 1, wherein metal ion levels are less than 50 ppb for each metal ion.

23. The process of forming an image on a substrate comprising the steps of:

a) coating the substrate with the antireflective coating composition of claim 1, b) heating the antireflective coating, c) coating a photoresist solution on top of the antireflective coating, d) heating the photoresist coating to substantially remove solvent from the photoresist coating, e) imagewise exposing the photoresist coating, f) developing an image using an aqueous alkaline developer, g) optionally, heating the substrate prior to and after development, h) dry etching the antireflective coating.

24. The process of claim 23, wherein the photoresist solution comprises a novolak resin, a photosensitive compound and a solvent.

25. The process of claim 23, wherein the photoresist solution comprises a substituted polyhydroxystyrene, a photoactive compound and a solvent.

26. The process of claim 23, wherein the photoresist solution comprises polyhydroxystyrene, a photoactive compound, a dissolution inhibitor and a solvent.

27. The process of claim 23, wherein the heating temperature for the antireflective coating ranges from about 70° C. to about 250° C.

28. The process of claim 23, wherein the developer is an aqueous solution of metal ion free alkaline hydroxide.

* * * * *